(12) United States Patent
Smith et al.

(10) Patent No.: US 11,405,134 B2
(45) Date of Patent: Aug. 2, 2022

(54) APPARATUS AND METHOD FOR COMMUNICATING DATA OVER AN OPTICAL CHANNEL

(71) Applicant: MARVELL ASIA PTE, LTD., Singapore (SG)

(72) Inventors: Benjamin P. Smith, Ottawa (CA); Arash Farhoodfar, San Jose, CA (US)

(73) Assignee: MARVELL ASIA PTE LTD., Singapore (SG)

( * ) Notice: Subject to any disclaimer, the term of this patent is extended or adjusted under 35 U.S.C. 154(b) by 39 days.

(21) Appl. No.: 17/127,510

(22) Filed: Dec. 18, 2020

(65) Prior Publication Data

US 2021/0111833 A1    Apr. 15, 2021

Related U.S. Application Data

(63) Continuation of application No. 16/853,514, filed on Apr. 20, 2020, now Pat. No. 10,903,937, which is a
(Continued)

(51) Int. Cl.
*H04L 1/00* (2006.01)
*H03M 13/25* (2006.01)
(Continued)

(52) U.S. Cl.
CPC ........ *H04L 1/0044* (2013.01); *H03M 13/256* (2013.01); *H03M 13/2906* (2013.01); *H04B 10/50* (2013.01); *H04B 10/516* (2013.01); *H04B 10/5161* (2013.01); *H04B 10/532* (2013.01); *H04B 10/541* (2013.01);
(Continued)

(58) Field of Classification Search
CPC ..... H04L 1/0044; H04L 1/004; H04L 1/0041; H04L 1/0045; H04L 1/0058; H04L 1/006; H04L 1/0065; H03M 13/256; H03M 13/2906; H04B 10/50; H04B 10/516;
(Continued)

(56) References Cited

U.S. PATENT DOCUMENTS

| 8,751,910 B2 | 6/2014 | Farhoodfar et al. |
| 2015/0003827 A1 | 1/2015 | Calderon et al. |
| 2016/0164709 A1 | 6/2016 | Kim et al. |

OTHER PUBLICATIONS

COAST-OHI-2013-041, Interaction between GFEC and OTL4.10/OTL4.4, Cortina Systems, Abstract, Jun. 1-13, 2013, pp. 1 8, Vancouver, BC.
(Continued)

*Primary Examiner* — Leslie C Pascal

(57) ABSTRACT

An optical module processes first FEC (Forward Error Correction) encoded data produced by a first FEC encoder. The optical module has a second FEC encoder for further coding a subset of the first FEC encoded data to produce second FEC encoded data. The optical module also has an optical modulator for modulating, based on a combination of the second FEC encoded data and a remaining portion of the first FEC encoded data that is not further coded, an optical signal for transmission over an optical channel. The second FEC encoder is an encoder for an FEC code that has a bit-level trellis representation with a number of states in any section of the bit-level trellis representation being less than or equal to 64 states. In this manner, the second FEC encoder has relatively low complexity (e.g. relatively low transistor count) that can reduce power consumption for the optical module.

31 Claims, 6 Drawing Sheets

Related U.S. Application Data continuation of application No. 16/451,986, filed on Jun. 25, 2019, now Pat. No. 10,659,192, which is a continuation of application No. 16/155,610, filed on Oct. 9, 2018, now Pat. No. 10,374,750, which is a continuation of application No. 15/494,366, filed on Apr. 21, 2017, now Pat. No. 10,128,980, which is a continuation of application No. 14/976,100, filed on Dec. 21, 2015, now Pat. No. 9,654,253.

(51) Int. Cl.
*H04B 10/50* (2013.01)
*H04B 10/516* (2013.01)
*H04B 10/54* (2013.01)
*H03M 13/29* (2006.01)
*H04B 10/532* (2013.01)
*H04B 10/69* (2013.01)

(52) U.S. Cl.
CPC .......... *H04B 10/697* (2013.01); *H04L 1/004* (2013.01); *H04L 1/006* (2013.01); *H04L 1/0041* (2013.01); *H04L 1/0045* (2013.01); *H04L 1/0058* (2013.01); *H04L 1/0065* (2013.01)

(58) Field of Classification Search
CPC  H04B 10/5161; H04B 10/532; H04B 10/541; H04B 10/697
See application file for complete search history.

(56) References Cited

OTHER PUBLICATIONS

International Telecommunications Union, ITU-T G.709/Y.1331 (Feb. 1, 2012), Telecommunication Standardization Sector of ITU, Series G: Transmission Systems and Media, Digital Systems and Networks, Digital terminal equipments—General, Series Y: Global Information Infrastructure, Internet Protocol Aspects and Next-Generation Networks, Internet protocol aspects—Transport, Interfaces for the optical transport network, pp. 1-240.

John D'Ambrosia, IEEE P802.3bs Baseline Summary, Jul. 18, 2015, retrieved from http://www.ieee802.org/3/bs/baseline_3bs_0715.pdf.

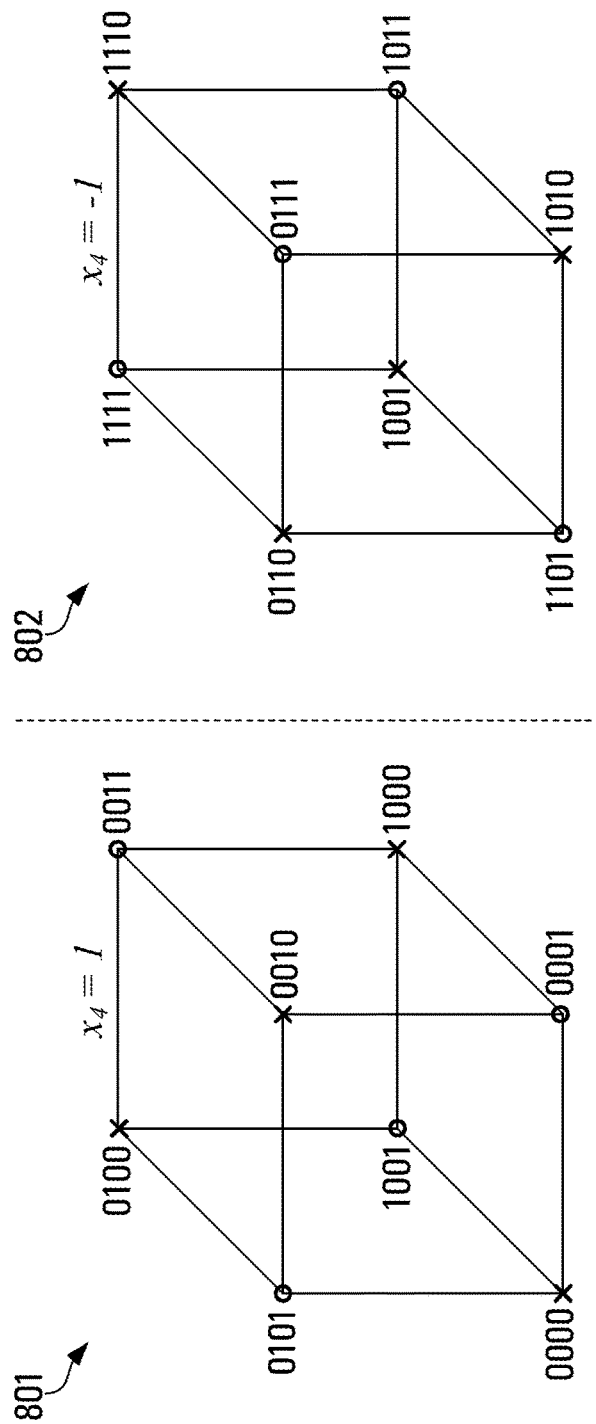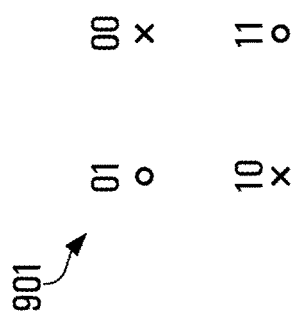
FIG. 8
FIG. 9

APPARATUS AND METHOD FOR COMMUNICATING DATA OVER AN OPTICAL CHANNEL

RELATED APPLICATION

This application is a continuation of U.S. patent application Ser. No. 16/853,514 filed Apr. 20, 2020, which is a continuation of U.S. patent application Ser. No. 16/451,986 filed Jun. 25, 2019, now U.S. Pat. No. 10,659,192 issued May 19, 2020, which is a continuation of U.S. patent application Ser. No. 16/155,610 filed Oct. 9, 2018, now U.S. Pat. No. 10,374,750 issued on Aug. 6, 2019, which is a continuation of U.S. patent application Ser. No. 15/494,366 filed Apr. 21, 2017, now U.S. Pat. No. 10,128,980 issued on Nov. 13, 2018, which is a continuation of U.S. patent application Ser. No. 14/976,100 filed on Dec. 21, 2015, now U.S. Pat. No. 9,654,253 issued on May 16, 2017, the entire disclosures of which are incorporated by reference.

FIELD OF THE DISCLOSURE

This application relates to communication systems, and more particularly to communicating data over an optical channel.

BACKGROUND

An optical module of a communication system can send and/or receive data over an optical channel. The data can be coded by one or more FEC (Forward Error Correction) encoders prior to transmission over the optical channel. Such coding is performed because the optical channel distorts and adds noise to the transmitted data. The coding can enable the data to be recovered at a receiver even in the presence of impairments.

Performance of the coding can be determined based on whether the data can be recovered at the receiver. FEC codes with complex encoders and/or decoders can often achieve greater performance than codes with less complex FEC encoders and/or decoders.

SUMMARY OF THE DISCLOSURE

Although FEC codes with complex encoders and/or decoders can often achieve greater performance than less complex FEC schemes, complex FEC encoders and decoders often consume more power. In some applications, power consumption is of little concern, as achieving a high level of performance is more important than reducing power consumption. However, in other applications, reducing power consumption is a concern.

The present disclosure provides an optical module configured for processing first FEC encoded data produced by a first FEC encoder. The optical module has an interface for receiving the first FEC encoded data, and a second FEC encoder for further coding a subset of the first FEC encoded data to produce second FEC encoded data. The optical module also has an optical modulator for modulating, based on a combination of the second FEC encoded data and a remaining portion of the first FEC encoded data that is not further coded, an optical signal for transmission over an optical channel.

In accordance with an embodiment of the disclosure, the second FEC encoder is an encoder for an FEC code that has a bit-level trellis representation with a number of states in any section of the bit-level trellis representation being less than or equal to 64 states. In this manner, the second FEC encoder has relatively low complexity (e.g. relatively low transistor count) that can reduce power consumption for the optical module.

The present disclosure also provides a communication system including a transport circuit having the first FEC encoder, and the optical module summarised above. In some implementations, the first FEC encoder implements a G.975.1/G.709-compliant FEC code.

The present disclosure also provides a corresponding optical module and a corresponding communication system for processing received FEC encoded data in a manner that is complementary to the optical module and the communication system summarised above.

Other aspects and features of the present disclosure will become apparent, to those ordinarily skilled in the art, upon review of the following description of the various embodiments of the disclosure.

BRIEF DESCRIPTION OF THE DRAWINGS

Embodiments will now be described by way of example with reference to the attached drawings in which:

FIGS. 8 and 9 are graphs of other set partitioning constellations; and

DETAILED DESCRIPTION OF EMBODIMENTS

It should be understood at the outset that although illustrative implementations of one or more embodiments of the present disclosure are provided below, the disclosed systems and/or methods may be implemented using any number of techniques. The disclosure should in no way be limited to the illustrative implementations, drawings, and techniques illustrated below, including the designs and implementations illustrated and described herein, but may be modified within the scope of the appended claims along with their full scope of equivalents.

Example Communication System

Figure 1:
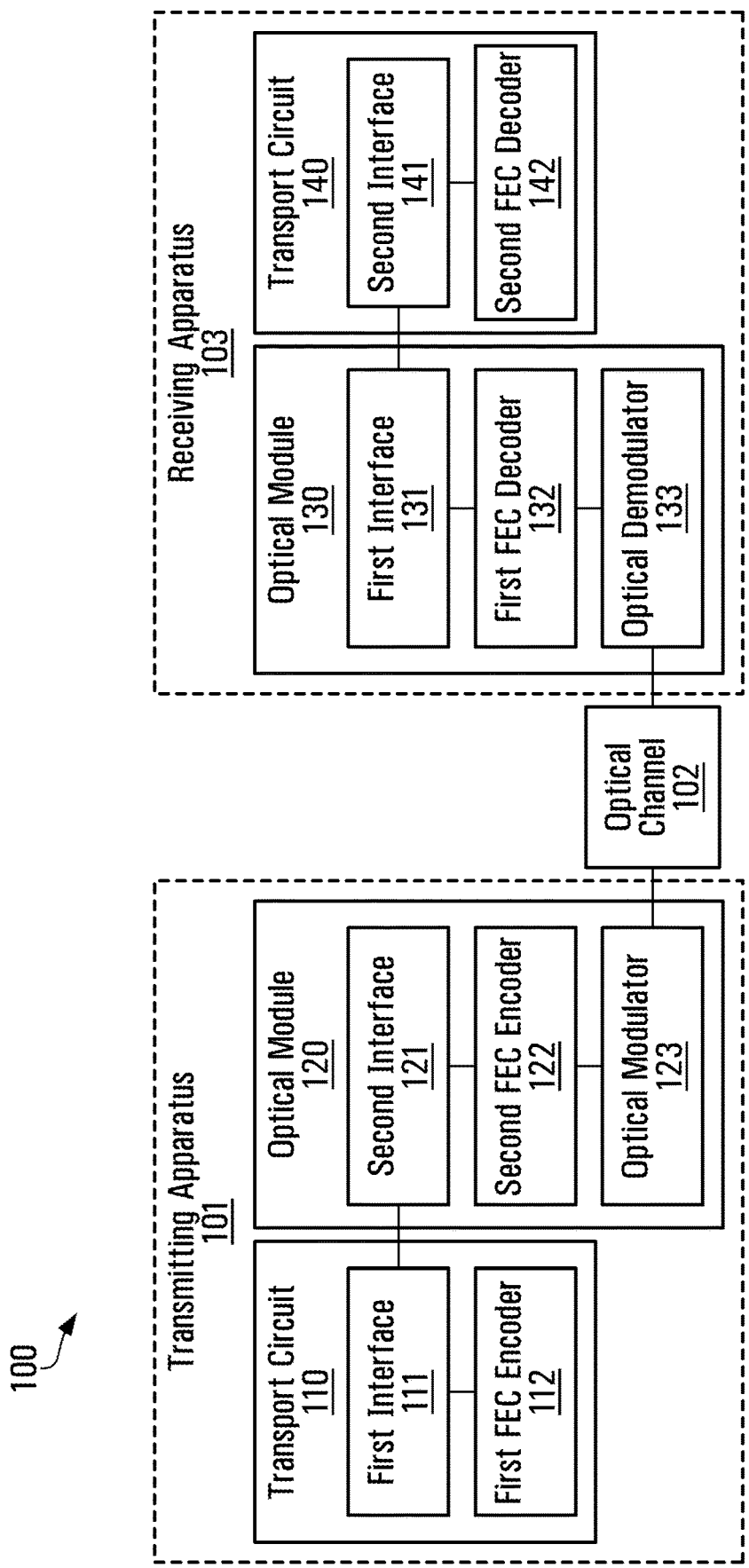
FIG. 1 is a block diagram of an example communication system having a transmitting apparatus and a receiving apparatus.

Referring now to FIG. 1, shown is a block diagram of an example communication system 100 having a transmitting apparatus 101 and a receiving apparatus 103. The transmitting apparatus 101 is coupled to the receiving apparatus 103 through an optical channel 102. The communication system 100 may have other components, but they are not shown for simplicity.

The transmitting apparatus 101 has a transport circuit 110, an optical module 120, and may have other components that are not shown. The transport circuit 110 has a first interface 111, a first FEC encoder 112, and may have other components that are not shown. The optical module 120 has a second interface 121, a second FEC encoder 122, an optical modulator 123, and may have other components that are not shown.

The receiving apparatus 103 has an optical module 130, a transport circuit 140, and may have other components that are not shown. The optical module 130 has a first interface 131, a first FEC decoder 132, an optical demodulator 133, and may have other components that are not shown. The transport circuit 140 has a second interface 141, a second FEC decoder 142, and may have other components that are not shown.

Operation of the communication system 100 will now be described by way of example. The transmitting apparatus 101 has data to be communicated to the receiving apparatus 103 over the optical channel 102. In order to enable the data to be recovered at the receiving apparatus 103 even when noise has been introduced by the optical channel 102, the transmitting apparatus 101 performs FEC coding of the data prior to optical transmission.

In particular, the first FEC encoder 112 performs coding of the data to produce first FEC encoded data, and sends the first FEC encoded data using the first interface 111. The optical module 120 receives the first FEC encoded data using the second interface 121, and the second FEC encoder 122 further codes a subset of the first FEC encoded data to produce second FEC encoded data. Finally, the optical modulator 123 modulates, based on a combination of the second FEC encoded data and a remaining portion of the first FEC encoded data that is not further coded, an optical signal for transmission over the optical channel 102.

According to an embodiment of the disclosure, the second FEC encoder 122 is an encoder for an FEC code that has a bit-level trellis representation with a number of states in any section of the bit-level trellis representation being less than or equal to 256 states. In this manner, the second FEC encoder 122 has relatively low complexity (e.g. relatively low transistor count) that can reduce power consumption for the optical module 120. In some implementations, the number of states in any section of the bit-level trellis representation is 32 states. Other implementations with less or more states (e.g. 16 or 64 states) are possible.

The "bit-level trellis representation" of an FEC code as used herein implies an encoder that calculates output bits as a function of input bits contained within a window of at most N consecutive input bits. This window "slides" in a direction of the future as encoding progresses, where $2^i$ is the maximum number of states in any section of the trellis; the trellis states are defined by the sets of possible values of the bits within the current window of at most N consecutive input bits. The encoding function applied to the windowed bits, to compute the output bit, may vary as a function of the position of the output bit in the codeword of the second FEC encoder 122. While this is an encoding-centric description, it is not limited to encoder implementations. Rather, it defines a class of FEC codes that can be used for encoder implementations and/or decoder implementations.

There are many possibilities for the second FEC encoder 122. In some implementations, the second FEC encoder 122 implements an extended Hamming code. In other implementations, the second FEC encoder 122 implements a convolutional code. Regardless, the second FEC encoder 122 has low complexity as noted above. This is in contrast with the first FEC encoder 112, which in some implementations has higher complexity than the second FEC encoder 122 because reducing power consumption for the transport circuit 110 by sacrificing complexity and resulting performance of the first FEC encoder 112 is not considered to be a desirable trade-off. In some implementations, the first FEC encoder 112 implements a G.975.1/G.709-compliant FEC code. An example of this is described in U.S. Pat. No. 8,751,910, which is incorporated by reference in its entirety. However, other hard-decision FECs with good coding gain can be used.

The optical signal that has been transmitted travels over the optical channel 102 and is received by the receiving apparatus 103. The optical channel 102 introduces noise into the optical signal. Consequently, the optical signal that is received is not exactly identical to the optical signal that was transmitted. The receiving apparatus 103 processes the optical signal that is received in order to recover the data.

In particular, the optical demodulator 133 demodulates the optical signal to produce received FEC encoded data. The first FEC decoder 132 decodes a subset of the received FEC encoded data to produce first FEC decoded data. The subset that is decoded corresponds to the subset that was further coded by the second FEC encoder 122 of the transmitting apparatus 101. The optical module 130 sends, to the transport circuit 140 using the first interface 131, a combination of the first FEC decoded data and a remaining portion of the received FEC encoded data that is not decoded. The transport circuit 140 receives the combination using the second interface 141, and the second FEC decoder 142 decodes the combination to recover the data.

The first FEC decoder 132 of the receiving apparatus 103 is complementary to the second FEC encoder 122 of the transmitting apparatus 101. Likewise, the second FEC decoder 142 of the receiving apparatus 103 is complementary to the first FEC encoder 112 of the transmitting apparatus 101.

Therefore, according to an embodiment of the disclosure, the first FEC decoder 132 is a decoder for an FEC code that has a bit-level trellis representation with a number of states in any section of the bit-level trellis representation being less than or equal to 256 states. In this manner, the first FEC decoder 132 has relatively low complexity (e.g. relatively low transistor count) that can reduce power consumption for the optical module 130. In some implementations, the number of states in any section of the bit-level trellis representation is 32 states. Other implementations with less or more states (e.g. 16 or 64 states) are possible.

Furthermore, in some implementations, the first FEC decoder 132 implements an extended Hamming code. In other implementations, the first FEC decoder 132 implements a convolutional code. Other implementations are possible to the extent that they are complementary with the implementations for the second FEC encoder 122 of the transmitting apparatus 101. Regardless, the first FEC decoder 132 has low complexity as noted above. This is in contrast with the second FEC decoder 142, which in some implementations has higher complexity than the first FEC decoder 132 because reducing power consumption for the transport circuit 140 by sacrificing complexity and resulting performance of the second FEC decoder 142 is not considered to be a desirable trade-off. In some implementations, the second FEC decoder 142 implements a G.975.1/G.709-compliant FEC code. An example of this is described in U.S. Pat. No. 8,751,910, which is incorporated by reference in its entirety. However, other hard-decision FECs with good coding gain can be used.

The second FEC encoder 122 and the first FEC decoder 132 are present in the communication system 100 and have been described to have relatively low complexity. If the complexity were to be increased, for example using an LDPC (Low-Density Parity-Check) code with BICM (Bit-Interleaved-Coded-Modulation), then power consumption for the optical modules 120, 130 would be higher. If the second FEC encoder 122 and the first FEC decoder 132 were to be omitted, then performance would be sub-optimal. Thus, embodiments of the disclosure archive a compromise between performance and power consumption.

In some implementations, the transmitting apparatus 101 and the receiving apparatus 103 have similar or even identical configurations. In particular, the receiving apparatus 103 may also have components for generating and transmitting an optical signal, and the transmitting apparatus 101 may also have components for receiving and processing an optical signal. Thus, optical communication may be supported in both directions. In some implementations, for bi-directional communication, there are two optical channels, namely one optical channel per direction of transmission.

Figure 10:
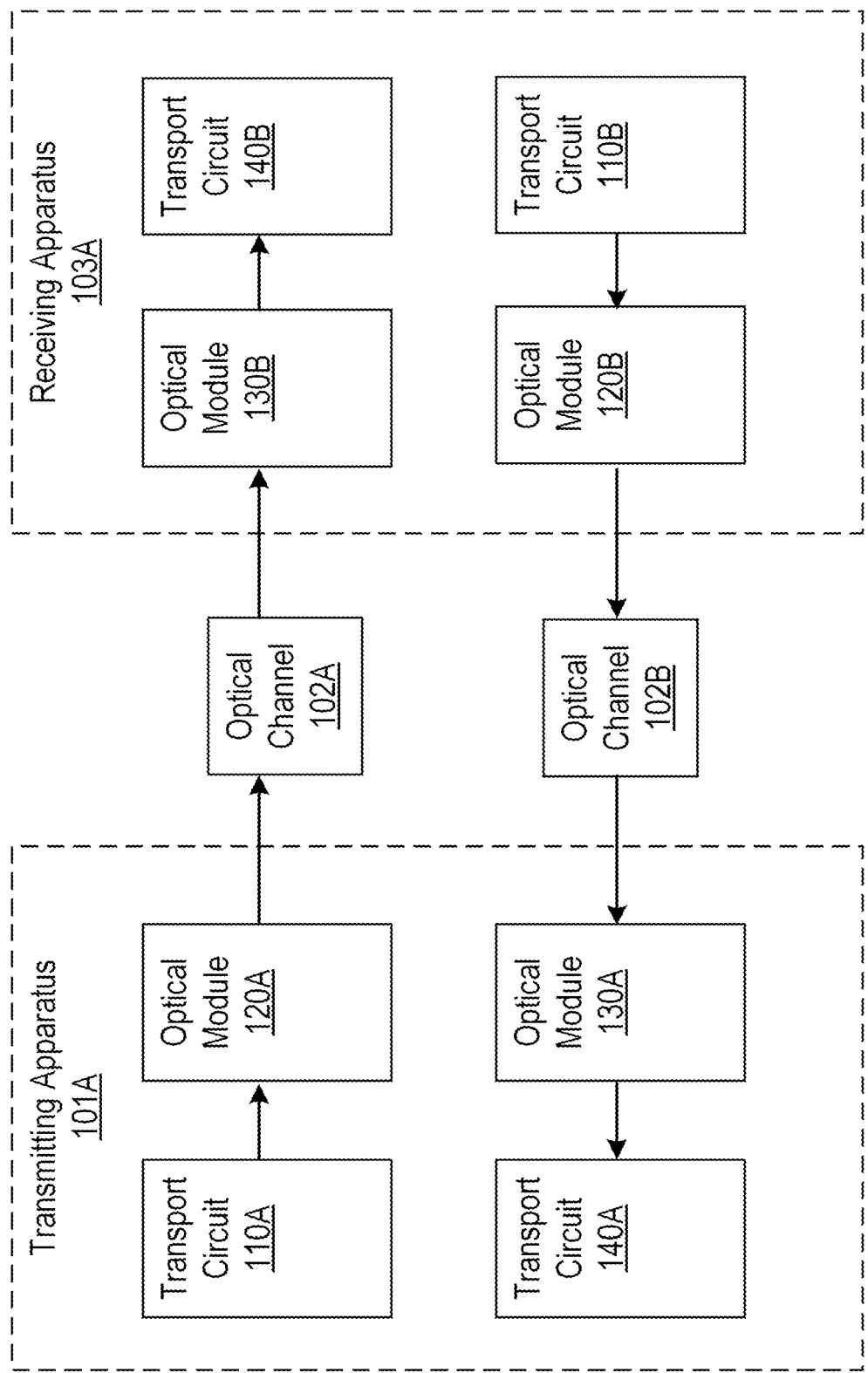
FIG. 10 is a block diagram of a transmitting apparatus and a receiving apparatus that support optical communication in both directions.

In some implementations, the transmitting apparatus 101 and the receiving apparatus 103 have similar or even identical configurations. In particular, the receiving apparatus 103 may also have components for generating and transmitting an optical signal, and the transmitting apparatus 101 may also have components for receiving and processing an optical signal. Thus, optical communication may be supported in both directions. In some implementations, for bi-directional communication, there are two optical channels, namely one optical channel per direction of transmission. For example, as shown in FIG. 10, a transmitting apparatus 101A may include a transmitting transport circuit 110A and a transmitting optical module 120A for transmitting first data over a first optical channel 102A, and may also include a receiving optical module 130A and a receiving transport circuit 140A for receiving second data from a second optical channel 102B, while a a receiving apparatus 103A may include a a receiving optical module 130B and a receiving transport circuit 140B for receiving the first data from the first optical channel 102A, and may also include transmitting transport circuit 110B and a transmitting optical module 120B for transmitting the second data over the second optical channel 102B. The transport circuits 110A and 110B may be identical to the transport module 110 of FIG. 1, the optical modules 120A ands 120B may be identical to the optical module 120 of FIG. 1, the optical modules 130A ands 130B may be identical to the optical module 130 of FIG. 1, and the transport circuits 140A and 140B may be identical to the transport module 140 of FIG. 1.

Example Methods

Figure 2:
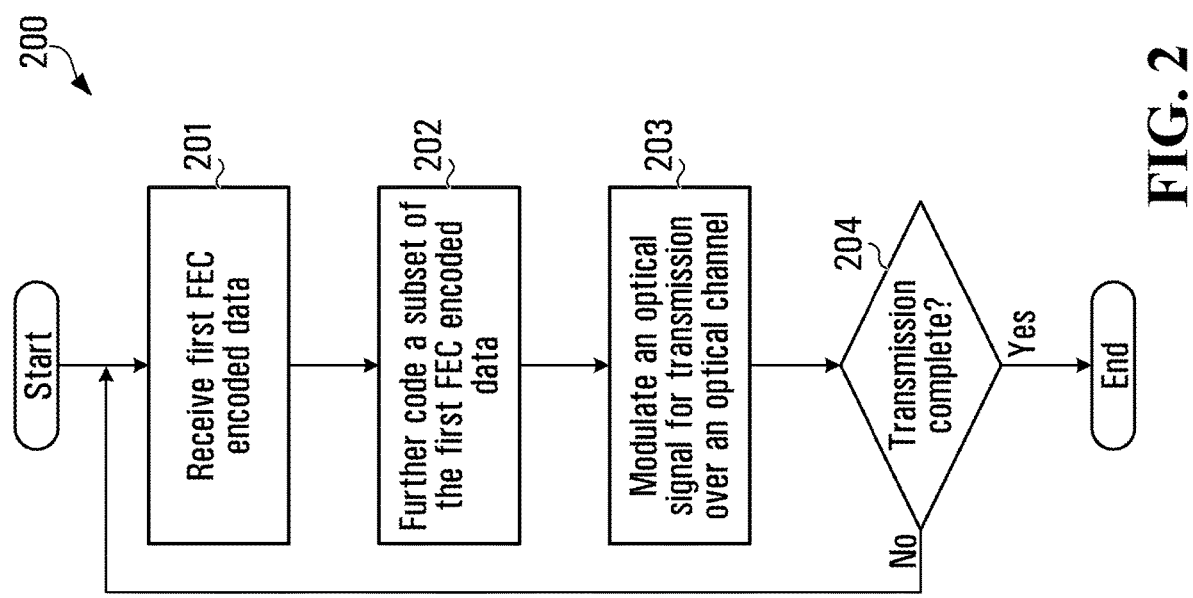
FIG. 2 is a flow chart of an example method for generating and transmitting an optical signal.

Referring now to FIG. 2, shown is a flow chart of an example method for generating and transmitting an optical signal. This method may be implemented by an optical module, for example by the optical module 120 of the transmitting apparatus 101 shown in FIG. 1.

At step 201, the optical module receives first FEC encoded data, which has been produced by a first FEC encoder. At step 202, the optical module further codes a subset of the first FEC encoded data to produce second FEC encoded data. According to an embodiment of the disclosure, the coding at step 202 is performed using a second FEC encoder that has relatively low complexity (e.g. relatively low transistor count), for example the second FEC encoder 122 described above with reference to FIG. 1. In this manner, power consumption for the optical module can be reduced as similarly described above with reference to FIG. 1.

In some implementations, the optical module splits the first FEC encoded data into an LSB (Least Significant Bit) sequence and an MSB (Most Significant Bit) sequence, such that the LSB sequence is the subset of the first FEC encoded data that is further coded by the second FEC encoder to produce the second FEC encoded data. The MSB sequence is not further coded by the second FEC encoder, which can help to reduce complexity of the second FEC encoder.

At step 203 the optical module modulates, based on a combination of the second FEC encoded data and a remaining portion of the first FEC encoded data that is not further coded, an optical signal for transmission over an optical channel. For implementations in which there is an MSB sequence that is not further coded by the second FEC encoder, the modulation is based on a combination of the second FEC encoded data and the MSB sequence.

If at step 204 the transmission is complete, then the method concludes. However, if at step 204 the transmission is not complete because there is more data to send, then the method loops back to step 201. Steps 201 through 203 are repeated until the transmission is complete.

Figure 3:
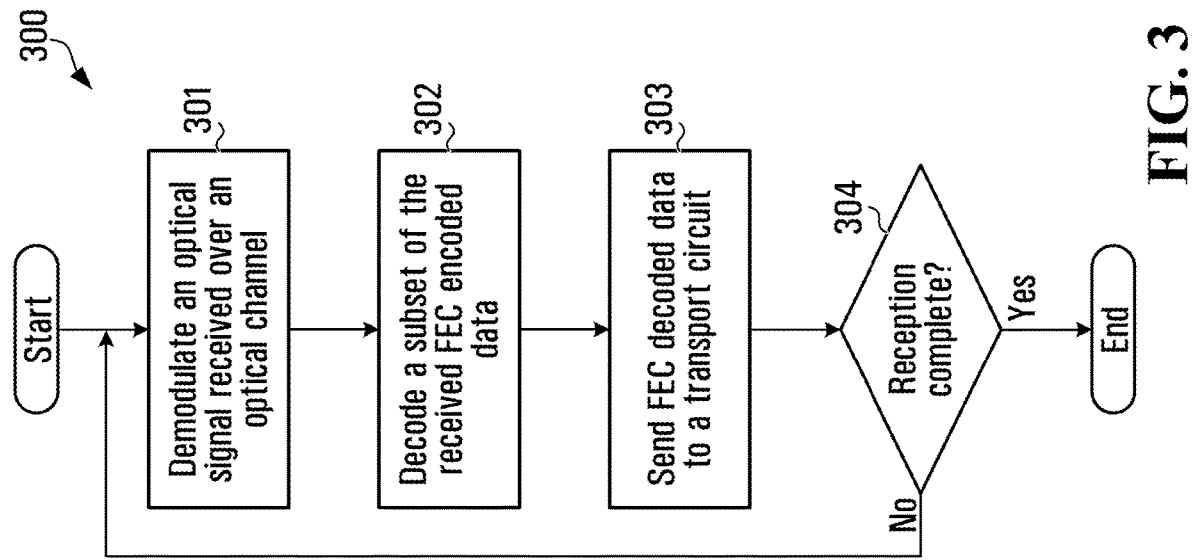
FIG. 3 is a flow chart of an example method for receiving and processing an optical signal.

Referring now to FIG. 3, shown is a flow chart of an example method for receiving and processing an optical signal. This method may be implemented by an optical module, for example by the optical module 130 of the receiving apparatus 103 shown in FIG. 1.

At step 301, the optical module demodulates an optical signal received over an optical channel to produce received FEC encoded data. At step 302 the optical module decodes a subset of the received FEC encoded data to produce first FEC decoded data. According to an embodiment of the disclosure, the decoding at step 302 is performed using a first FEC decoder that has relatively low complexity (e.g. relatively low transistor count), for example the first FEC decoder 132 described above with reference to FIG. 1. In this manner, power consumption for the optical module can be reduced as similarly described above with reference to FIG. 1.

In some implementations, the optical module splits the received FEC encoded data into an LSB sequence and an MSB sequence, such that the LSB sequence is the subset of the received FEC encoded data that is decoded by the first FEC decoder to produce the first FEC decoded data. The subset of the received FEC encoded data that is decoded corresponds to a subset that was further coded by a transmitting apparatus. The MSB sequence is not further decoded by the first FEC decoder, which can help to reduce complexity of the first FEC decoder.

At step 303 the optical module sends, to a transport circuit, a combination of the first FEC decoded data and a remaining portion of the received FEC encoded data that is not decoded. The transport circuit then decodes the combination to recover the data. For implementations in which there is an MSB sequence that is not decoded by the first FEC decoder, the optical module sends a combination of the first FEC decoded data and the MSB sequence to the transport circuit for decoding.

If at step 304 the reception is complete, then the method concludes. However, if at step 304 the reception is not complete because there is more data to receive, then the method loops back to step 301. Steps 301 through 303 are repeated until the reception is complete.

Example Transmitting Apparatus

Figure 4:
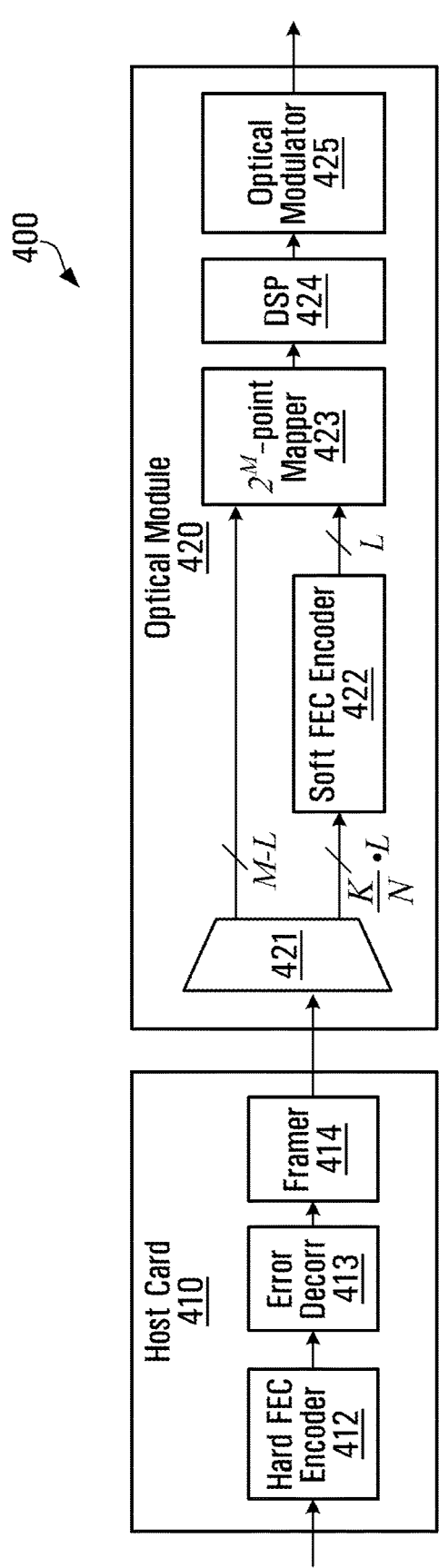
FIG. 4 is a block diagram of an example transmitting apparatus.

Referring now to FIG. 4, shown is a block diagram of an example transmitting apparatus 400. The transmitting apparatus 400 has a host card 410, an optical module 420, and may have other components that are not shown. The host card 410 has a hard FEC encoder 412, an error decorelator 413, a framer 414, and may have other components that are not shown. The optical module 420 has a demultiplexer 421, a soft FEC encoder 422, a $2^M$-point mapper 423, a DSP (Digital Signal Processor) 424, an optical modulator 425, and may have other components that are not shown.

Operation of the transmitting apparatus 400 will now be described by way of example. The host card 410 receives data to be communicated to a receiving apparatus over an optical channel. In order to enable the data to be recovered at the receiving apparatus even when noise has been introduced by the optical channel, the transmitting apparatus 400 performs FEC coding of the data prior to optical transmission. As described in further detail below, the FEC coding is performed by a combination of two FEC encoders: the hard FEC encoder 412 and the soft FEC encoder 422.

The hard FEC encoder 412 performs coding of the data to produce hard FEC encoded data. The hard FEC encoded data is processed by the error decorelator 413 before the framer 414 frames the hard FEC encoded data for transmission to the optical module 420. In some implementations, the error decorelator 413 performs interleaving, which, when used with a corresponding error decorelator (e.g. error decorelator 543 shown in FIG. 5) at a receiving apparatus, serves to randomize positions of errors at the input of a hard FEC decoder (e.g. hard FEC decoder 544 shown in FIG. 5).

In some implementations, the transmission to the optical module 420 is over an OTL (Optical channel Transport Lane) interface. In some implementations, each frame is an OTUk (Optical channel Transport Unit[1]) frame as standardized by ITU (International Telecommunication Union) in G.709/Y.1331 (Feb. 2012) Interfaces for the optical transport network, which is incorporated by reference in its entirety and hereinafter referred to as "ITU G.709". Other interfaces and frames are possible and are within the scope of this disclosure.

[1] k (=1,2,3,4) indicates rate (e.g. OTU1=10 Gbps, OTU2=10 Gbps, OTU3=40 Gbps, OTU4=100 Gbps)

The optical module 420 receives the hard FEC encoded data using the second interface 121. The demultiplexer 421 splits the hard FEC encoded data into an LSB sequence and an MSB sequence. The LSB sequence is further coded by the soft FEC encoder 422 to produce soft FEC encoded data. The MSB sequence is not further coded by the soft FEC encoder 422. The $2^M$-point mapper 423 maps a combination of the soft FEC encoded data and the MSB sequence into data symbols. The data symbols are processed by the DSP 424 prior to the optical modulator 425 modulating, based on the output of the DSP 424, an optical signal for transmission over an optical channel.

In some implementations, the DSP 424 performs conversion of the symbols. For example, a pair of PAM-4 (Pulse-Amplitude Modulation) symbols can be converted to a QAM-16 (Quadrature-Amplitude Modulation) symbol. Further details of such conversion will be discussed later with reference to FIGS. 6 and 7. In some implementations, the DSP 424 also performs pre-equalization. In some implementations, the pre-equalization is accomplished using an FIR (Finite Impulse Response) filter with a small number of taps, for example 2 or 3 taps. In other implementations, the pre-equalization is accomplished using a more complicated pre-equalizer that compensates for nonlinearities that may be caused by the optical modulator 425 or the optical channel. Other implementations are possible.

According to an embodiment of the disclosure, the soft FEC encoder 422 is an encoder that has relatively low complexity (e.g. relatively low transistor count) such as the second FEC encoder 122 described above with reference to FIG. 1. In this manner, power consumption for the optical module 420 can be reduced as similarly described above with reference to FIG. 1. This is in contrast with the hard FEC encoder 412, which in some implementations is an encoder that has relatively high complexity such as the first FEC encoder 112 described above with reference to FIG. 1.

In some implementations, power consumption in the optical module 420 is reduced with only a minor degradation in end-to-end performance. This can be accomplished by appropriately concatenating the soft FEC encoder 422, which has relatively low complexity (e.g. relatively low transistor count), with the hard FEC encoder 412, which is a powerful hard-decision outer FEC encoder. In some implementations, the hard FEC encoder 412 consumes significantly less power than a powerful soft-decision FEC, and has an advantage of existing within the host card 410, where sensitivity to power consumption is reduced.

The transmitting apparatus 400 uses an MLC (multi-level coding) for the soft FEC encoder 422. In some implementations, the constellation of the $2^M$-point mapper 423 is labelled using a mixed Gray/set-partitioned constellation labelling, such that the LSB sequence in the M-bit label act as L subset selection bits, which have been encoded by the soft FEC encoder 422 in the optical module 420. Note that the soft FEC encoder 422 is a block-based code that converts K input bits into N output bits. In some implementations, an elastic FIFO (First-In First-Out) is used to create the L-bit output. Furthermore, in some implementations, a memory used for the FIFO is also used to implement a block interleaver.

Example Receiving Apparatus

Figure 5:
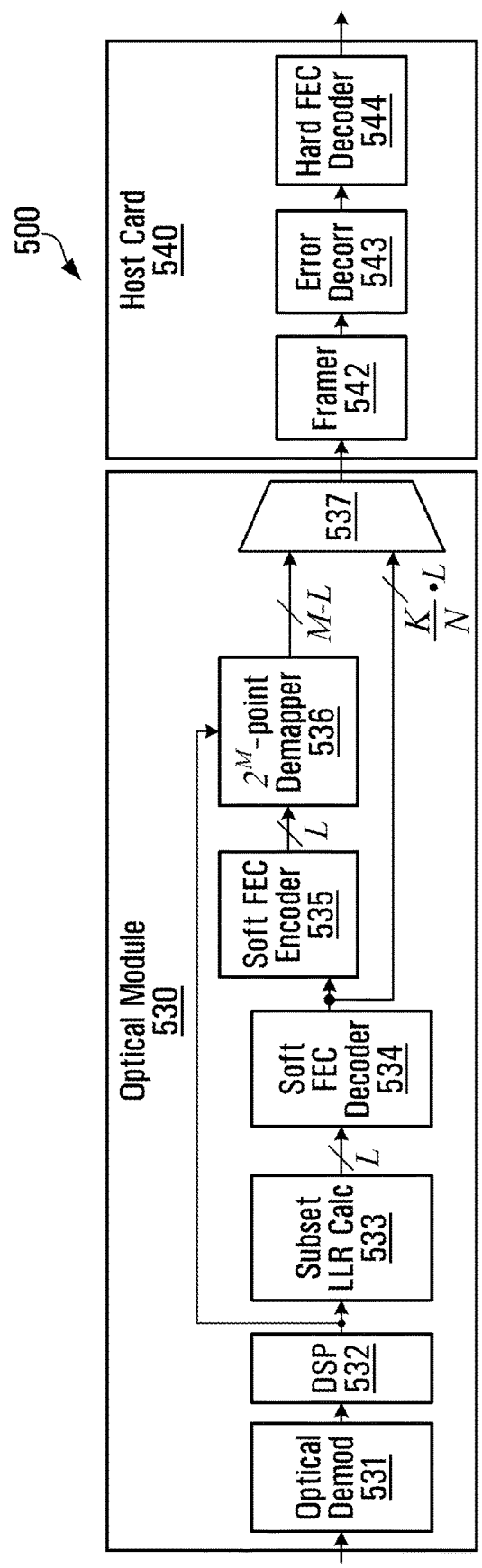
FIG. 5 is a block diagram of an example receiving apparatus.

Referring now to FIG. 5, shown is a block diagram of an example receiving apparatus 500. The receiving apparatus 500 has an optical module 530, a host card 540, and may have other components that are not shown. The optical module 530 has an optical demodulator 531, a DSP 532, a subset LLR (Log-likelihood Ratio) calculator 533, a soft FEC decoder 534, a soft FEC encoder 535, a $2^M$-point demapper 536, a multiplexer 537, and may have other components that are not shown. The host card 540 has a framer 542, an error decorelator 543, a hard FEC decoder 544, and may have other components that are not shown.

Operation of the receiving apparatus 500 will now be described by way of example. An optical signal that has been transmitted by a transmitting apparatus travels over an optical channel and is received by the receiving apparatus 500. The optical demodulator 531 demodulates the optical signal to produce received FEC encoded data. Note that the received FEC encoded data has been coded by the transmitting apparatus in order to enable the data to be recovered at the receiving apparatus 500 even when noise has been introduced by the optical channel. As described in further detail below, the FEC decoding is performed by a combination of two FEC decoders: the soft FEC decoder 534 and the hard FEC decoder 544.

The received FEC encoded data is processed by the DSP 532, which in some implementations performs processing that is complementary to the processing of the DSP 424 shown in FIG. 4. Additionally, or alternatively, the DSP 532 calculates soft estimates of the transmitted symbols. A subset of the received FEC encoded data is decoded by the soft FEC decoder 534 to produce soft FEC decoded data. To this end, the subset LLR calculator 533 processes the soft estimates from the DSP 532 to calculate magnitude and reliability estimates of the bits corresponding to the subset of the received FEC encoded data to the soft FEC decoder 534. In this example, the subset of the received FEC encoded data that is decoded by the soft FEC decoder 534 is an LSB sequence.

According to an embodiment of the disclosure, the soft FEC decoder 534 is a decoder that has relatively low complexity (e.g. relatively low transistor count) such as the first FEC decoder 132 described above with reference to FIG. 1. In this manner, power consumption for the optical module 530 can be reduced as similarly described above with reference to FIG. 1. This is in contrast with the hard FEC decoder 544, which in some implementations is a decoder that has relatively high complexity such as the second FEC decoder 142 described above with reference to FIG. 1.

In some implementations, the soft FEC decoder 534 uses soft information from the DSP 532 when performing the decoding. The way in which this is accomplished is implementation-specific, but in general soft information enables a more reliable determination of a "most likely" transmitted codeword. In absence of soft information, the soft FEC decoder 534 would find a candidate codeword with the fewest symbols that differ from the received signal; this is called a "hard"-decision metric, because symbols are either correct or incorrect. However, in presence of soft information, a most likely codeword is selected to minimize a "distance" between the soft received values and the candidate codewords; here, a possible metric is a Euclidean distance (i.e., root-sum-of-squares) between the soft values and the candidate codewords). Thus, soft information allows the soft FEC decoder 534 to use a different "distance" metric to identify the most likely transmitted codeword.

Exploiting soft information from the DSP 532 as described above can increase coding gain thereby increasing robustness and link operating margin of the system. Note that in the absence of a soft-decision FEC decoder in the optical module 530, soft information is discarded, as it cannot be readily transmitted to the host card. Connecting the optical module 530 to the host card 540 through an interface that can carry soft information involves excessive wiring and is not practical.

The multiplexer 537 combines the soft FEC decoded data and an MSB sequence of the received FEC encoded data, and the combination is transmitted to the host card 540. The MSB sequence is generated by the $2^M$-point demapper 536, which has two inputs: soft estimates of the transmitted symbols calculated by the DSP 532, and a processed LSB sequence that is generated by the soft FEC encoder 535 coding the soft FEC decoded data. By using the processed LSB sequence instead of the LSB sequence obtained directly from the soft estimates of the DSP 532, robustness in the demapping can be increased because the soft FEC decoder 534 may correct some errors prior to the demapping.

In some implementations, the transmission to the host card 540 is over an OTL interface. In some implementations, the transmission includes frames, each of which being an OTUk frame as standardized in ITU G.709. Other interfaces and frames are possible and are within the scope of this disclosure.

The host card 540 receives the combination, which is processed by the framer 542 and the error decorrelator 543 prior to being decoded by the hard FEC decoder 544 to recover the data. Residual errors that were not corrected by the soft FEC decoder 534 are corrected by the hard FEC decoder 544. In some implementations, the framer 542 performs processing that is complementary to framing that is performed by the transmitting apparatus. In some implementations, the error decorelator 543 performs de-interleaving that is complementary to interleaving that is performed by the transmitting apparatus. The error decorelator 543 serves to randomize positions of any errors at the input to the hard FEC decoder 544, which can improve performance.

In some implementations, power consumption in the optical module 530 is reduced with only a minor degradation in end-to-end performance. This can be accomplished by appropriately concatenating the soft FEC decoder 534, which has relatively low complexity (e.g. relatively low transistor count), with the hard FEC decoder 544, which is a powerful hard-decision outer FEC decoder. In some implementations, the hard FEC decoder 544 consumes significantly less power than a powerful soft-decision FEC, and has an advantage of existing within the host card 540, where sensitivity to power consumption is reduced.

In some implementations, the code rate in the host card 540 is fixed (e.g. R=239/255) by the OTN standard. For such implementations, the concatenation of the soft FEC decoder 534 and the hard FEC decoder 544 can better exploit the strength of the hard FEC decoder 544, while still being able to use soft information available from the DSP 532 in the optical module 530 as described above. In this manner, a suitable balance can be achieved between performance and power consumption.

Set Partitioning Examples

Figure 6:
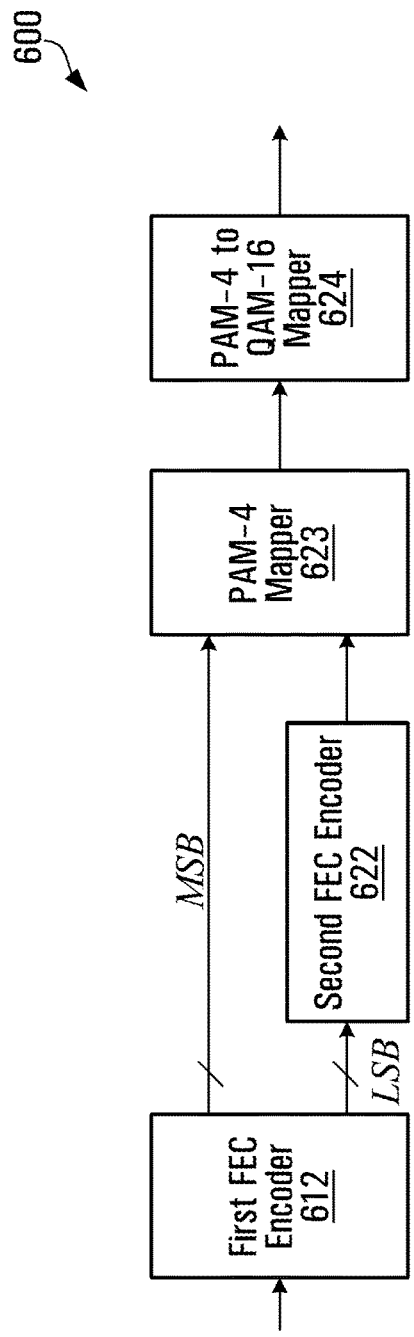
FIG. 6 is a block diagram of an example transmitting apparatus with set-partitioning mapping.

Referring now to FIG. 6, shown is a block diagram of an example transmitting apparatus 600 with set-partitioning mapping. The transmitting apparatus 600 has a first FEC encoder 612, a second FEC encoder 622, a PAM-4 mapper 623, a PAM-4 to QAM-16 mapper 624, and may have other components that are not shown.

The first FEC encoder 612 encodes data to produce first FEC encoded data, which in this example is split into an MSB sequence and an LSB sequence. The second FEC encoder 622 further encodes the LSB sequence to produce second FEC encoded data. The MSB sequence is not further encoded by the second FEC encoder 622.

Figure 7:
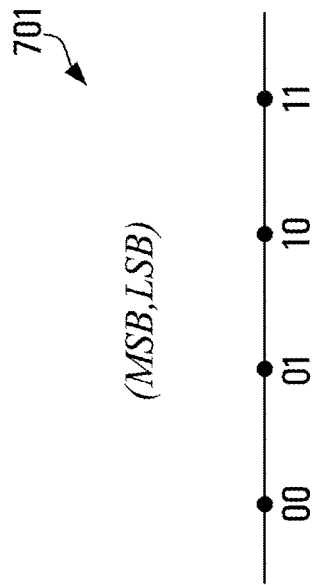
FIG. 7 is a graph of a set-partitioning constellation for the transmitting apparatus of FIG. 6.

A combination of the MSB sequence and the second FEC encoded data is mapped to PAM-4 symbols by the PAM-4 mapper 623. Next, each pair of the PAM-4 symbols is mapped to a QAM-16 symbol by the PAM-4 to QAM-16 mapper 624. Note that the combination of the PAM-4 mapper 623 and the PAM-4 to QAM-16 mapper 624 constitutes a decomposition of a $2^4$-point 2-D mapper block. Since a QAM-16 symbol can be represented as a Cartesian product of two PAM-4 symbols, the system can be described in terms of a PAM-4 constellation 701 as shown in FIG. 7.

While the transmitting apparatus 600 shown in FIG. 6 is described for QAM-16 modulation, it is to be understood that other QAM modulations are possible for a multi-dimensional mapper. In some implementations, the second FEC encoded data is a stream of set-partitioning bits for symbols of a PAM-M constellation. Thus, for example, a first symbol mapper generates PAM-M symbols, and a second symbol mapper for maps pairs of the PAM-M symbols into QAM-$M^2$ symbols. The transmitting apparatus 600 shown in FIG. 6 is a specific case where M=4. However, other values for M are possible and are within the scope of this disclosure.

In some implementations, an optical modulator (not shown) uses a multi-dimensional modulation scheme due to availability of real and complex dimensions on each of two orthogonal polarizations of light. However, the dimension of the optical modulator's modulation scheme need not be the same as the dimension of the multi-dimensional mapper. For example, a 4-D optical modulator could be used in concert with a 2-D mapper in which case two consecutive 2-D symbols are mapped to a single 4-D symbol. In a second example, an 8-D symbol mapper may be used in conjunction with a 4-D optical modulator in which case two consecutive 4-D symbols are used to transmit a single 8-D symbol.

There are many possibilities for the first FEC encoder 612 and the second FEC encoder 622. In some implementations, the first FEC encoder 612 is a transport IC encoder that has relatively high complexity such as the first FEC encoder 112 described above with reference to FIG. 1. In some implementations, the first FEC encoder 612 has a code rate of r=239/255. In some implementations, the second FEC encoder 622 is a module soft encoder that has relatively low complexity (e.g. relatively low transistor count) such as the second FEC encoder 122 described above with reference to FIG. 1. In some implementations, the second FEC encoder 622 has a code rate of r=1/2.

The first FEC encoder 612 is generally separate from the second FEC encoder 622. For instance, some implementations, the first FEC encoder 612 resides on a transport circuit of a host card, while the second FEC encoder 622 resides in an optical module that interfaces with the transport circuit. In other implementations, the first FEC encoder 612 resides within the same optical module as the second FEC encoder 622, but on a separate chip. Regardless of location, in some implementations, the first FEC encoder 612 is relied upon to protect bits that are not coded by the second FEC encoder 622 and to improve the BER (Bit Error Rate) of bits that are coded by the second FEC encoder.

In some implementations, the second FEC encoded data is a stream of set-partitioning bits for symbols of a DP-DQPSK (Dual-Polarization Differential Quadrature-Phase-Shift-Keying) constellation. DP-DQPSK is naturally described in terms of its 4-D constellation. This constellation includes 16 points, which can be represented by 16 possible 4-tuples in Euclidean space: (+/−1, +/−1, +/−1, +/−1). Note that different multi-level-coding schemes are possible, with different numbers of bits (from the 4-bit label) being set-partitioning bits coded by a soft FEC. Examples are described below with reference to FIGS. 8 and 9.

Referring now to FIG. 8, shown is a graph of a constellation 801, 802 in which only one of the four bits is a set-partitioning bit. Note that vertices represented by the same symbol (i.e., crosses or circles) have a common LSB, and that the constellation 801, 802 is a 4-D constellation represented by two projections: a first 3-D constellation 801 with $x_4=+1$, and a second 3-D constellation 802 with $x_4=-1$.

When two of the four bits are set-partitioning bits, it is possible to treat each polarization as an independent DQPSK scheme. Referring now to FIG. 9, shown is a graph of a constellation 901 in which one of the two bits in the DQPSK constellation is a set-partitioning bit.

Numerous modifications and variations of the present disclosure are possible in light of the above teachings. It is therefore to be understood that within the scope of the appended claims, the disclosure may be practised otherwise than as specifically described herein.

We claim:

1. A method of operating a communication system, the method comprising:
   coding, by a transmit transport circuit of a transmitting apparatus, first forward error correction (FEC) encoded data using a first FEC encoder;
   coding, by a transmit optical module of the transmitting apparatus, a subset of the first FEC encoded data to produce second FEC encoded data using a second FEC encoder;
   modulating, by the transmit optical module, an optical signal for transmission over an optical channel based on a combination of the second FEC encoded data and a remaining portion of the first FEC encoded data that is not further coded;
   demodulating, by a receive optical module of a receiving apparatus, the optical signal received over the optical channel to produce received FEC encoded data;
   decoding, by the receive optical module, a subset of the received FEC encoded data to produce first FEC decoded data using a first FEC decoder; and
   decoding, by a receive transport circuit of the receiving apparatus, a combination of the first FEC decoded data and a remaining portion of the received FEC encoded data that is not decoded to produce recovered data using a second FEC decoder.

2. The method of claim 1 wherein the second FEC encoder is an encoder for an FEC code that has a bit-level trellis representation with a number of states;
   wherein the first FEC decoder is a decoder for an FEC code that has a bit-level trellis representation with a number of states; and
   wherein the number of states in any section of the bit-level trellis representation of the FEC code for the second FEC encoder or the first FEC decoder is less than or equal to 256 states.

3. The method of claim 1 wherein the second FEC encoder or the first FEC decoder implements an extended Hamming code or a convolutional code; and
   wherein the first FEC encoder or the second FEC decoder implements a G.975.1/G.709-compliant FEC code.

4. The method of claim 1 wherein the first FEC encoder comprises a hard FEC encoder, the second FEC encoder comprises a soft FEC encoder, the first FEC decoder comprises a soft FEC decoder, and the second FEC decoder comprises a hard FEC decoder.

5. The method of claim 1 further comprising
   sending, by a first transmit interface of the transmit transport circuit, the first FEC encoded data to the transmit optical module;
   receiving, by a second transmit interface of the transmit optical module, the first FEC encoded data from the first transmit interface;
   sending, by a first receive interface of the receive optical module, the combination of the first FEC decoded data and the remaining portion of the received FEC encoded data that is not decoded to the receive transport circuit; and
   receiving, by a second receive interface of the receive transport circuit, the combination of the first FEC decoded data and the remaining portion of the received FEC encoded data that is not decoded from the first receive interface.

6. The method of claim 5 wherein the first transmit interface, the second transmit interface, the first receive interface or the second receive interface comprises an optical channel transport lane interface or an ITU G.709 interface.

7. The method of claim 1 wherein modulating, by the transmit optical module, the optical signal comprises
   modulating, by an optical modulator of the transmit optical module, the optical signal for transmission over the optical channel based on a combination of the second FEC encoded data and the remaining portion of the first FEC encoded data that is not further coded; and
   wherein demodulating, by the receive optical module, the optical signal comprises demodulating, by an optical demodulator of the receive optical module, the optical signal received over the optical channel to produce the received FEC encoded.

8. The method of claim 1 wherein the first FEC decoder is configured to be complementary to the second FEC encoder, and wherein the second DEC decoder is configured to be complementary to the first FEC encoder.

9. The method of claim 1 further comprising
generating and transmitting, by the receiving apparatus, an optical signal; and
receiving and processing, by the transmitting apparatus, an optical signal;
wherein the transmitting apparatus and the receiving apparatus are configured for bi-directional communication.

10. The method of claim 9 wherein the optical channel comprises two optical channels, including a first optical channel configured for transmission of an optical signal from the transmitting apparatus to the receiving apparatus and a second optical channel configured for transmission from the receiving apparatus to the transmitting apparatus.

11. The method of claim 1 wherein the transmit transport circuit is configured within a transmit host card; and
wherein the receive transport circuit is configured within a receive host card.

12. The method of claim 1 further comprising:
processing, by a transmit error decorrelator of the transmitting apparatus, the first FEC encoded data;
framing, by a transmit framer of the transmitting apparatus, the first FEC encoded data for transmission to the transmit optical module;
deframing, by a receive framer of the receiving apparatus, the combination of the first FEC decoded data and the remaining portion of the received FEC encoded data that is not decoded; and
processing, by a receive error decorrelator of the receiving apparatus, the combination of the first FEC decoded data and the remaining portion of the received FEC encoded data that is not decoded.

13. The method of claim 12 wherein the transmit transport circuit is configured within a transmit host card, the transmit host card comprising the first FEC encoder, the transmit error decorrelator, and the transmit framer; and
wherein the receive transport circuit is configured within a receive host card, the receive host card comprising the receive framer, the receive error decorrelator, and the second FEC decoder.

14. The method of claim 12 further comprising
interleaving, by the transmit error decorrelator, the first FEC encoded data; and
deinterleaving, by the receive error decorrelator, the combination of the first FEC decoded data and the remaining portion of the received FEC encoded data that is not decoded;
wherein the interleaving, by the transmit error decorrelator, and the de-interleaving, by the receive error decorrelator, randomizes positions of errors in the optical signal.

15. The method of claim 1 further comprising
splitting, by a demultiplexer of the transmit optical module, the first FEC encoded data into a Least Significant Bit (LSB) sequence and a Most Significant Bit (MSB) sequence;
wherein the LSB sequence is the subset of the first FEC encoded data that is further coded by the second FEC encoder to produce the second FEC encoded data.

16. The method of claim 1 further comprising
mapping into symbols, by a symbol mapper of the transmit optical module, the combination of the second FEC encoded data and the remaining portion of the first FEC encoded data that is not further coded; and
demapping, by a symbol demapper of the receive optical module, the symbols.

17. The method of claim 16 wherein mapping into symbols, by the symbol mapper, comprises:
mapping into first symbols, by a first symbol mapper of the transmit optical module, the combination of the second FEC encoded data and the remaining portion of the first FEC encoded data that is not further coded; and
mapping into second symbols, by a second symbol mapper of the transmit optical module, the first symbols.

18. The method of claim 16 wherein mapping into symbols, by the symbol mapper, comprises:
mapping into PAM-M symbols, by a first symbol mapper of the transmit optical module, the combination of the second FEC encoded data and the remaining portion of the first FEC encoded data that is not further coded; and
mapping into QAM-M2 symbols, by a second symbol mapper of the transmit optical module, the PAM-M symbols.

19. The method of claim 16 wherein the second FEC encoded data is a stream of set-partitioning bits for symbols of a DP-DQPSK (Dual-Polarization Differential Quadrature-Phase-Shift-Keying) constellation or wherein the second FEC encoded data is a stream of set-partitioning bits for symbols of a PAM-M (Pulse-Amplitude Modulation) constellation.

20. The method of claim 16 further comprising
processing, by a transmit digital signal processer (DSP) of the transmit optical module, the symbols; and
modulating, by an optical modulator of the transmit optical module, the optical signal based on the symbols for transmission over the optical channel.

21. The method of claim 20 further comprising
converting, by the transmit DSP, the symbols; and
de-converting, by a receive DSP of the receive optical module, the symbols.

22. The method of claim 16 further comprising
calculating, by a receive digital signal processor (DSP) of the receive optical module, soft estimates of the symbols; and
wherein decoding, by the receive optical module, the subset of the received FEC encoded data using the first FEC decoder comprises decoding, by the first FEC decoder, the subset of the received FEC encoded data using the soft estimates.

23. The method of claim 22 further comprising
processing, by a subset LLR calculator of the receive optical module, the soft estimates of the symbols to calculate magnitude and reliability estimates of bits corresponding to the subset of the received FEC encoded data;
wherein decoding, by the receive optical module, the subset of the received FEC encoded data using the first FEC decoder comprises decoding, by the first FEC decoder, the subset of the received FEC encoded data using the magnitude and reliability estimates.

24. The method of claim 22 wherein decoding, by the receive optical module, the subset of the received FEC encoded data using the first FEC decoder comprises decoding, by the first FEC decoder, the subset of the received FEC encoded data using the soft estimates by determining a most likely transmitted codeword according to a distance metric.

25. The method of claim 24 wherein the distance metric is a Euclidean distance metric.

26. The method of claim 22 further comprising
generating, by a symbol demapper of the receive optical module, a Most Significant Bit (MSB) sequence of the received FEC encoded data using the soft estimates; and
combining, by a multiplexer of the receive optical module, the first FEC decoded data and the MSB sequence for transmission to a receive host card including the receive transport circuit.

27. The method of claim 26 further comprising
coding, by an FEC encoder of the receive optical module, the first FEC decoded data to produce a processed Least Significant Bit (LSB) sequence;
wherein generating, by the symbol demapper, the MSB sequence comprises generating, by the symbol demapper, the MSB sequence using the soft estimates and the processed LSB sequence.

28. The method of claim 1 further comprising
combining, by a multiplexer of the receive optical module, the first FEC decoded data and the remaining portion of the received FEC encoded data that is not decoded.

29. The method of claim 28 where the subset of the received FEC encoded data is a Least Significant Bit (LSB) sequence and the remaining portion of the received FEC encoded data is a Most Significant Bit (MSB) sequence.

30. A method of operating a communication system, the method comprising:
encoding, by a transmit transport circuit of a transmitting apparatus, first forward error correction (FEC) encoded data using a first FEC encoder;
interleaving, by the transmit transport circuit, the first FEC encoded data;
framing, by the transmit transport circuit, the first FEC encoded data;
splitting, by a transmit optical module of the transmitting apparatus, the first FEC encoded data into a Least Significant Bit (LSB) sequence and a Most Significant Bit (MSB) sequence;
encoding, by the transmit optical module, the LSB sequence to produce second FEC encoded data using a second FEC encoder;
mapping, by the transmit optical module, the combination of the second FEC encoded data and the MSB sequence into symbols;
modulating, by the transmit optical module, an optical signal based on the symbols for transmission over an optical channel; and
demodulating, by a receive optical module of a receiving apparatus, the optical signal to produce received FEC encoded data;
calculating, by the receive optical module, soft estimates;
decoding, by the receive optical module, an LSB sequence of the received FEC encoded data using a first FEC decoder with the soft estimates to produce first FEC decoded data;
encoding, by the receive optical module, the first FEC decoded data using an FEC encoder to produce a processed LSB sequence
producing, by the receive optical module, an MSB sequence of the received FEC encoded data using the soft estimates and the processed LSB sequence;
combining, by the receive optical module, the first FEC decoded data and the MSB sequence;
deframing, by a receive transport circuit of the receiving apparatus, the combination of the first FEC decoded data and the MSB sequence;
de-interleaving, by the receive transport circuit, the combination of the first FEC decoded data and the MSB sequence;
decoding, by the receive transport circuit, the combination of the first FEC decoded data and the MSB sequence using a second FEC decoder to produce recovered data.

31. A method of operating a communication system, the method comprising:
encoding, by a first forward error correction (FEC) encoder of a transmit host card within a transmitting apparatus, first FEC encoded data;
interleaving, by a transmit error decorrelator of the transmit host card, the first FEC encoded data;
framing, by a framer of the transmit host card, the first FEC encoded data;
splitting, by a demultiplexer of transmit optical module within the transmitting apparatus, the first FEC encoded data into a Least Significant Bit (LSB) sequence and a Most Significant Bit (MSB) sequence;
encoding, by a second FEC encoder of the transmit optical module, the LSB sequence to produce second FEC encoded data;
mapping, by a symbol mapper of the transmit optical module, the combination of the second FEC encoded data and the MSB sequence into first symbols;
converting, by a transmit digital signal processer (DSP) of the transmit optical module, the first symbols into second symbols;
modulating, by an optical modulator of the transmit optical module, an optical signal based on the second symbols for transmission over an optical channel;
demodulating, by an optical demodulator of a receive optical module within a receiving apparatus, the optical signal to produce received FEC encoded data;
de-interleaving, by a receive DSP of the receive optical module, the received FEC encoded data;
calculating, by the receive DSP, soft estimates;
processing, by a subset Log-Likelihood Ratio (LLR) calculator of the receive optical module, the soft estimates;
decoding, by a first FEC decoder of the receive optical module, an LSB sequence of the received FEC encoded data using the soft estimates to produce first FEC decoded data;
encoding, by an FEC encoder of the receive optical module, the first FEC decoded data to produce a processed LSB sequence;
generating, by a symbol demapper of the receive optical module, an MSB sequence of the received FEC encoded data using the soft estimates and the processed LSB sequence;
combining, by a multiplexer of the receive optical module, the first FEC decoded data and the MSB sequence;
deframing, by a deframer of a receive host card within the receiving apparatus, the combination of the first FEC decoded data and the MSB sequence;
de-interleaving, by a receive error decorrelator of the receive host card, the combination of the first FEC decoded data and the MSB sequence; and
decoding, by a second FEC decoder of the receive host card, the combination of the first FEC decoded data and the MSB sequence to produce recovered data.

* * * * *